US010211131B1

(12) United States Patent
Kitnarong et al.

(10) Patent No.: US 10,211,131 B1
(45) Date of Patent: Feb. 19, 2019

(54) SYSTEMS AND METHODS FOR IMPROVED ADHESION BETWEEN A LEADFRAME AND MOLDING COMPOUND IN A SEMICONDUCTOR DEVICE

(71) Applicant: Microchip Technology Incorporated, Chandler, AZ (US)

(72) Inventors: Rangsun Kitnarong, Meaung Nonthaburi (TH); Chawalit Pinyo, Bangkok (TH); Vichanart Nimibutr, Meaung Nonthaburi (TH); Vorawat Pangwong, Bangkok (TH); Kritsada Inchum, Sa Kaeo (TH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/727,048

(22) Filed: Oct. 6, 2017

(51) Int. Cl.
*H01L 21/56* (2006.01)
*H01L 23/00* (2006.01)
*H01L 23/495* (2006.01)

(52) U.S. Cl.
CPC ...... *H01L 23/49548* (2013.01); *H01L 21/563* (2013.01); *H01L 21/568* (2013.01);
(Continued)

(58) Field of Classification Search
CPC ............. H01L 23/495; H01L 23/49582; H01L 23/49548; H01L 24/45; H01L 23/13;
(Continued)

(56) References Cited

U.S. PATENT DOCUMENTS

2002/0153596 A1* 10/2002 Tsubosaki ........... H01L 21/6835
257/666
2009/0039486 A1* 2/2009 Shimazaki ............ H01L 21/561
257/676

(Continued)

FOREIGN PATENT DOCUMENTS

JP 64-67949 * 3/1989 ............. H01L 23/50

*Primary Examiner* — Jasmine J Clark
(74) *Attorney, Agent, or Firm* — Slayden Grubert Beard PLLC

(57) ABSTRACT

An integrated circuit device having improved delamination properties is provided. The integrated circuit may include a leadframe having a die support area supporting an integrated circuit die, and a plurality of leadframe leads. Surfaces of the leadframe leads are roughened by a roughening process to form roughened surfaces having an average roughness $R_a$. A thin plating layer is formed over the roughened leadframe lead surfaces, with a plating layer thickness of less than 40 times the roughness $R_a$ of the leadframe lead surfaces, such that the thin plating layer is received into the roughened leadframe lead surface contours and thereby itself has a contoured outer surface. A molding material applied to the structure may directly contact and adhere to the contoured surface of the thin plating layer. The adhesion between the molding material and the contoured plating layer may reduce or eliminate delamination of the molding material from the leadframe.

33 Claims, 3 Drawing Sheets

(52) U.S. Cl.
CPC ........ *H01L 23/49579* (2013.01); *H01L 24/45* (2013.01); *H01L 24/48* (2013.01)

(58) Field of Classification Search
CPC ......... H01L 23/49503; H01L 23/49575; H01L 23/4951; H01L 23/49517; H01L 23/49541; H01L 23/39545; H01L 23/3142; H01L 23/3107; H01L 23/3114; H01L 21/4828
USPC .................. 257/666–677, E23.031–E23.059; 438/123
See application file for complete search history.

(56) References Cited

U.S. PATENT DOCUMENTS

2014/0319666 A1* 10/2014 Paek ................. H01L 23/49582
257/676
2017/0110389 A1* 4/2017 Hayashi .............. H01L 23/3114

* cited by examiner

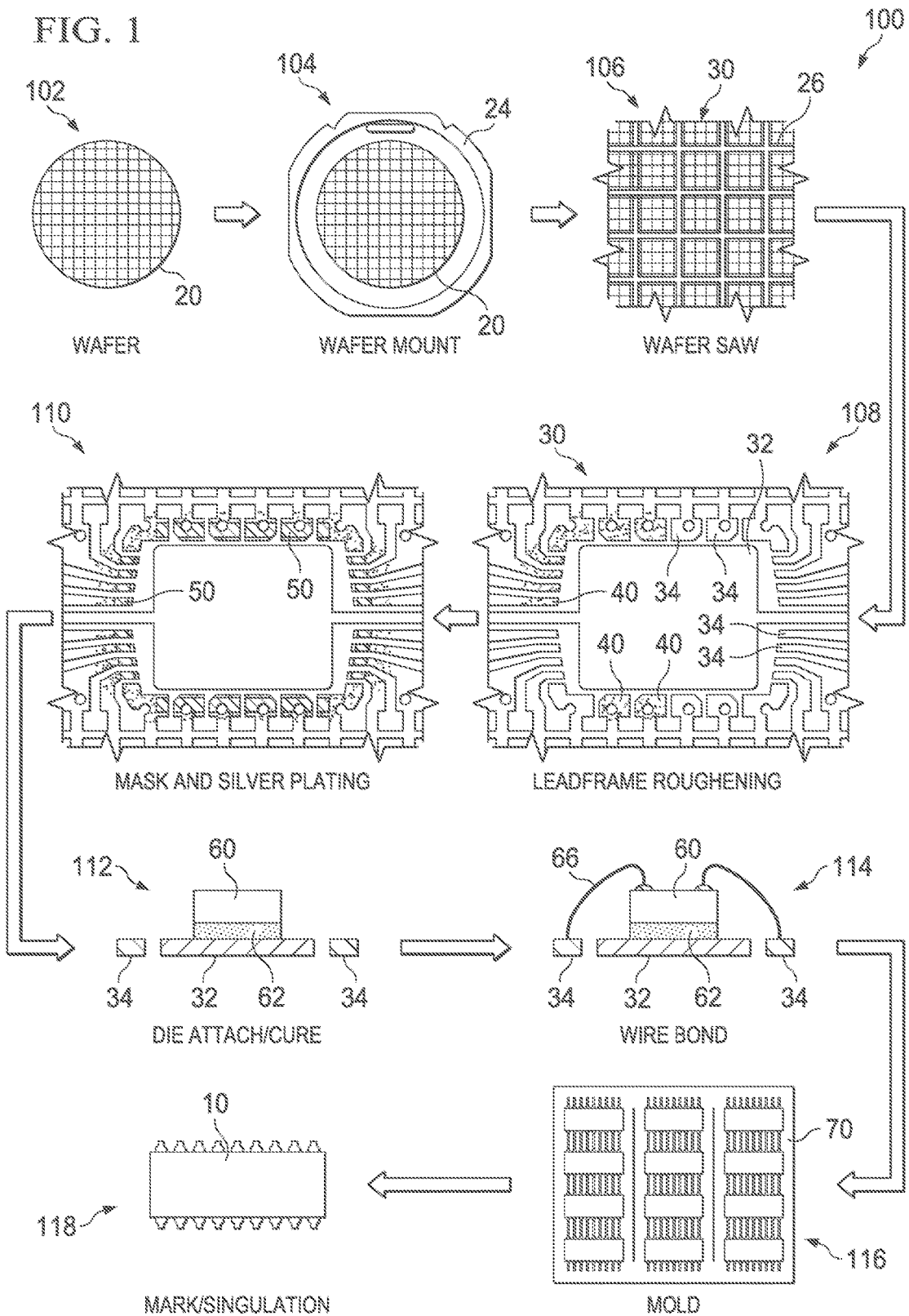

SYSTEMS AND METHODS FOR IMPROVED ADHESION BETWEEN A LEADFRAME AND MOLDING COMPOUND IN A SEMICONDUCTOR DEVICE

TECHNICAL FIELD

The present disclosure relates to semiconductor manufacturing, e.g., to systems and methods for providing improved adhesion between a leadframe surface and molding compound material formed over the leadframe, thereby reducing or eliminating delamination of the molding compound from the leadframe.

BACKGROUND

Many or most integrated circuit ("IC") packages encounter delamination after the moisture loading requirement of 85° C. & 85% humidity for a duration of 168 hours, as specified by JEDEC MSL ("Moisture Sensitivity Level") testing. In this contest, delamination refers to a separation between silver plated leadfinger areas and a mold compound, due to poor adhesion between the mold compound and the silver plated areas. Silver plating is known to having a smooth surface and thus the molding compound often does not adhere properly to the plated areas. Delamination may affect the IC packaging, resulting in package and wire bond weaknesses during reliability testing, such as when stress is applied to the package, e.g., due to moisture, temperature or humidity. Delamination may also result tin product field failures such as broken or lifted wire bonds.

Thus, there is a need for eliminating leadfinger delamination in IC packages, such as 8L SOIC & 28SOIC semiconductor device housings, for example. The JEDEC requirement mandates zero delamination on wire bonding areas using palladium coated copper wire at MSL 1, which rating indicates that the devices is not moisture sensitive. Components must be mounted and reflowed within the allowable period of time (floor life out of the bag). One way to reduce or eliminate the leadfinger delamination is to downgrade the devices to MSL3, which rating defines a maximum of one week exposure to ambient conditions before the device is assembled on a PCB. However, this typically adds substantial cost to the parts and requires special handling of the parts by the customer when removing the parts from moisture barrier bags.

Another approach intended to address this problem is to remove the silver plating on lead frame to allow the molding compound to increase the adhesion with the copper surface of the lead frame. This helps reduce the delamination but does not solve the problem, as silver plating is required for wire bonding.

SUMMARY

According to various embodiments, leadframe delamination can be eliminated and a wire bonding process is made more reliable. According to some embodiments, a surface roughening process is performed to roughen one or more surfaces of the leadframe, and a thin plating layer (e.g., silver plating) is applied over the roughened leadframe surface(s). The plating layer may be sufficiently thin such that the plating material is received in the contours of the roughened leadframe surface(s) and thus forms a contoured outer surface of the plating layer itself. The roughened leadframe surface(s) and contoured outer surface of the plating layer may provide improved molding adhesion and delamination characteristics for chip packages or other integrated circuit structures.

One embodiment provides a method for manufacturing an integrated circuit device, wherein the method includes providing a leadframe comprising a die support area configured to receive an integrated circuit die, and a leadframe lead adjacent the die support area; roughening a surface of the leadframe lead to form a roughened leadframe lead surface having three-dimensional contours having an average roughness $R_a$ defined by an average distance from the roughened leadframe lead surface to a mean plane of the roughened leadframe lead surface, along a direction perpendicular to the mean plane; forming a thin plating layer over at least a portion of the roughened leadframe lead surface to define a plated leadframe lead area, wherein a ratio of the thin plating layer thickness to the average roughness $R_a$ of the respective roughened leadframe lead surface is less than 40, such that the thin plating layer is received into the three-dimensional contours of the roughened leadframe lead surface and thereby forms a three-dimensionally contoured surface at an outer surface of the thin plating layer; and applying a molding material over the leadframe and integrated circuit die such that the molding material contacts and adheres to the three-dimensionally contoured surface at the outer surface of the thin plating layer.

In one embodiment, the thin plating layer comprises silver.

In one embodiment, the leadframe comprises copper, and the thin plating layer comprises silver.

In one embodiment, the leadframe comprises a plurality of leadframe leads adjacent the die support area; and the method comprises roughening a surface of each leadframe lead to form a roughened leadframe lead surface on each leadframe lead, and forming a thin plating layer on each roughened leadframe lead surface, wherein a ratio of the thin plating layer thickness to the average roughness $R_a$ of the respective roughened leadframe lead surface is less than 40.

In one embodiment, the method further includes forming a wire bond between the plated leadframe lead area of the leadframe lead and the integrated circuit die on the die support area; and wherein the molding material is applied over the wire bond.

In one embodiment, the leadframe lead includes a first area and a second area adjacent the first area; roughening a surface of the leadframe lead comprises roughening a surface of both the first area and the second area of the leadframe lead to form a roughened first area surface and a roughened second area surface; and forming a thin plating layer over the roughened leadframe lead surface comprises forming a thin plating layer over the roughened first area surface but not over the roughened second area surface.

In one embodiment, the first area of the leadframe lead, on which the thin plating layer is formed, is located at an end of the leadframe lead adjacent the die support area; and the second area of the leadframe lead, on which the thin plating layer is not formed, is located away from the end of the leadframe lead, such that the first area of the leadframe lead is located between the second area of the leadframe lead and the die support area.

Alternatively, in another embodiment, the second area of the leadframe lead, on which the thin plating layer is not formed, is located at an end of the leadframe lead adjacent the die support area; and the first area of the leadframe lead, on which the thin plating layer is formed, is located away from the end of the leadframe lead, such that the second area of the leadframe lead is located between the first area of the leadframe lead and the die support area.

In one embodiment, the method includes applying the molding material over both the first area and second area of the leadframe lead, such that the molding material (a) directly contacts the thin plating layer formed on the first area of the leadframe lead and (b) directly contacts the roughened second area surface of the second area of the leadframe lead, which is free of the thin plating layer.

In one embodiment, the thickness of the thin plating layer is less than or equal to 3.75 μm.

In one embodiment, the average roughness $R_a$ of the roughened leadframe lead surface is at least 0.150 μm; and the thickness of the thin plating layer is less than or equal to 3.75 μm.

In one embodiment, the ratio of the thin plating layer thickness to the average roughness $R_a$ of the respective roughened leadframe lead surface is less than 30.

In one embodiment, the ratio of the thin plating layer thickness to the average roughness $R_a$ of the respective roughened leadframe lead surface is less than 20.

In one embodiment, the ratio of the thin plating layer thickness to the average roughness $R_a$ of the respective roughened leadframe lead surface is less than 10.

In one embodiment, the ratio of the thin plating layer thickness to the average roughness $R_a$ of the respective roughened leadframe lead surface is less than 5.

In one embodiment, the method further includes roughening a surface of the die support area; and securing the integrated circuit die to the roughened surface of the die support area using an epoxy.

Another embodiment provides an integrated circuit structure, comprising a leadframe including a die support area configured to receive an integrated circuit die; and a plurality of leadframe leads adjacent the die support area, each leadframe lead including a finger tip area at one end of the leadframe lead. At least one of the leadframe leads has a roughening leadframe lead surface formed by a roughening process, each roughening leadframe lead surface having three-dimensional contours having an average roughness $R_a$ defined by an average distance from the respective roughened leadframe lead surface to a mean plane of the respective roughened leadframe lead surface, along a direction perpendicular to the mean plane. A thin plating layer is formed over at least a portion of each roughened leadframe lead surface, wherein a ratio of the thin plating layer thickness to the average roughness $R_a$ of the respective roughened leadframe lead surface is less than 40, such that each respective thin plating layer is received into the three-dimensional contours of the respective roughened leadframe lead surface and thereby forms a three-dimensionally contoured surface at an outer surface of the respective thin plating layer. A molding material is formed over the leadframe and integrated circuit die such that the molding material contacts and adheres to the three-dimensionally contoured surface at the outer surface of each thin plating layer.

In one embodiment of the integrated circuit structure, each leadframe lead includes a first area and a second area adjacent the first area; roughening a surface of each leadframe lead comprises roughening a surface of both the first area and the second area of the respective leadframe lead to form a roughened first area surface and a roughened second area surface; and forming a thin plating layer over each respective roughened leadframe lead surface comprises forming a thin plating layer over the roughened first area surface but not over the roughened second area surface of the respective leadframe lead.

In one embodiment of the integrated circuit structure, the molding material is formed over both the first area and second area of each leadframe lead, such that the molding material (a) directly contacts the thin plating layer formed on the first area of each respective leadframe lead and (b) directly contacts the roughened second area surface of the second area of each respective leadframe lead.

In one embodiment of the integrated circuit structure, the average roughness $R_a$ of each roughened leadframe lead surface is at least 0.150 μm; and the thickness of the thin plating layer formed over each roughened leadframe lead surface is less than or equal to 3.75 μm.

BRIEF DESCRIPTION OF THE FIGURES

Example embodiments are discussed below with reference to the drawings, in which:

FIG. 1 illustrates an example process for manufacturing an integrated circuit device having improved delamination properties, according to example embodiments of the present invention;

DETAILED DESCRIPTION

Figure 2A:
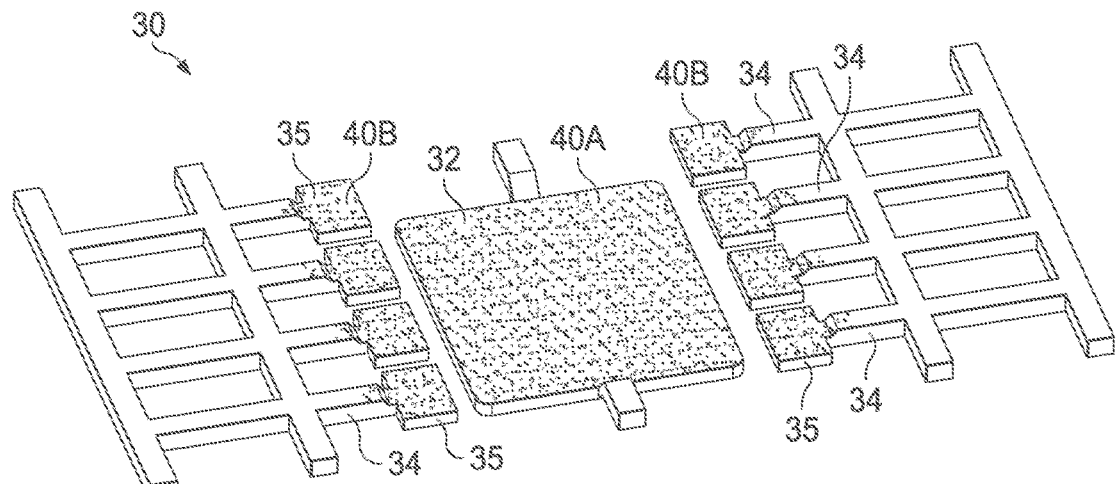
FIGS. 2A-2D shows example details for selected steps of the process of FIG. 1 directed to leadframe roughening, thin silver plating, and IC assembly (die attachment, wire bonding, and applying a mold compound), according to an example embodiment.

FIG. 1 illustrates an example process 100 for manufacturing an integrated circuit device 10 having improved delamination properties, according to example embodiments. A wafer 20 defining an array of IC device substrates 22 is manufactured or formed at step 102. At step 104, the wafer 20 may be mounted to a wafer mount 24, e.g., using epoxy and/or mount tape. At step 106, the wafer may be cut using a wafer saw, as indicated by cut lines 26, resulting in a number of leadframes 30, each having a die support region or "leadframe pad" 32 and a plurality of fingers or "leads" 34 adjacent and spaced apart from the leadframe pad 32.

At step 108, a roughening process may be performed to roughen one or more (or all) surface areas of the leadframe 30 to form roughened leadframe surface areas 40. For example, the roughening process may be designed to selectively roughen one or more areas of leadframe pad 32 each lead 34.

At step 110, a masking and silver plating process is performed to deposit a thin layer of silver plating 50 on selected areas of the leadframe 30. In particular, the thin silver plating layer 50 may be deposited over selected portions (or all) of the roughened leadframe surface areas 40. As discussed below, the thin silver plating layer 50 may be sufficiently thin (e.g., thickness of ≤3.75 μm) relative to the roughness of the roughened leadframe surface areas 40 (e.g., average roughness of 0.150 μm) such that an outer (e.g., top) surface of the silver plating layer 50 itself become contoured due to the contours of the underlying roughened leadframe surface 40.

At 112, an IC die 60 may be picked and attached to the leadframe pad 32 of each leadframe 30, e.g., using an epoxy 62 and curing process. At step 114, each die 60 may be wire bonded to the silver plated region 50 of each lead 34 of the respective leadframe 30, e.g., using palladium coated copper or gold wire bonds 66. At step 116, the structure may be molded in a plastic or other suitable molding compound 70. Depending on the particular embodiment, the molding compound 70 may directly contact (a) the contoured outer (e.g., top) surface of silver plated areas 50, and/or (b) roughened leadframe surface areas that are unplated by silver, and/or (c) unroughened and unplated area(s) of the leadframe surface. The contoured outer surface of silver plated areas 50, along with roughened leadframe surface areas in contact with the molding compound (if any) provide a secure adhesion, thereby locking the mold compound to the leads 34 and reducing or preventing delamination of the structure over time. At step 118, the wafer may be marked and singulated, resulting in a plurality of discrete IC devices/chips 10.

FIGS. 2A-2D shows example details for steps 108-116 of FIG. 1, including leadframe roughening, thin silver plating, and IC assembly (die attachment, wire bonding, and applying a mold compound), according to an example embodiment.

First, FIG. 2A shows an example leadframe 30 prior to being processed, e.g., by roughening the leadframe, silver plating the roughened leadframe, mounting an integrated circuit (IC) die to the leadframe, wire bonding the IC die to the leadframe, molding the leadframe, and cutting the leadframe out of a larger leadframe array. The example leadframes 30 shown in FIGS. 1 and 2A are formed with a pattern that defines a die support region or leadframe pad 32 configured to support an integrated circuit die 60 mounted thereto, a plurality of leads 34 arranged around a periphery of (and spaced apart from) the leadframe pad 32, and one or more connecting structures that physically connect the leadframe pad 32 to the rest of the leadframe 30 that includes the leads 34. Each lead 34 includes a tip region 35 proximate the leadframe pad 32 and configured for an electrical connection, e.g., by wire bond 66, to an integrated circuit die 60 mounted on the pad 32.

Leadframe 30 may be formed from any suitable material, e.g., copper or a copper alloy, a ferrous alloy containing nickel, cobalt, or chromium, nickel or a nickel alloy, or any other suitable material. A copper leadframe is discussed herein for the purposes of discussion; however, it should be understood that the concepts discussed herein are not limited to a copper leadframe but rather apply to leadframes of any other suitable materials. In addition, the shape and pattern of leadframes 30 shown herein are examples only; leadframe 30 may also may have any other suitable pattern and shape, including any other suitable arrangement of leadframe pad 32, leads 34, and connecting structures.

As discussed above regarding step 108 of FIG. 1, the disclosed process may include a roughening process to roughen one or more areas (or all) of the leadframe pad 32 and/or leads 34 to form roughened leadframe surface areas 40. For example, the roughening process may be designed to roughen one or more surface (e.g., top and bottom surfaces) of leadframe pad 32 and selectively roughen one or more partial or full surface areas (e.g., a partial top surface and a partial bottom surface) of each lead 34. FIG. 2A illustrates the result of an example roughening process performed on the leadframe 30, in which the leadframe pad 32 and proximate areas of leads 34 are roughed to define a roughened pad area 40A and roughened lead areas 40B, wherein the roughened areas 40A and 40B are indicated by dotted or speckled shading in FIG. 2A.

As discussed below, the roughing process may increase adhesion of molding compound 70 to the leadframe surface in areas in which the molding compound 70 directly contacts the leadframe surface. In addition, also discussed below, when a sufficiently thin plating layer (e.g., silver plating) is formed over a roughened leadframe surface areas 40, the thin plating layer may be received into the contours of the roughened leadframe surface and thus form a contoured outer surface of the thin plating layer itself, which may increase adhesion of molding compound 70 to the leadframe in the plated areas of the leadframe 30 (areas in which the molding compound 70 contacts the thin plating layer formed over the leadframe) and/or decrease or eliminate delamination of the molding compound 70 from the leadframe 30 over time.

Figure 2B:
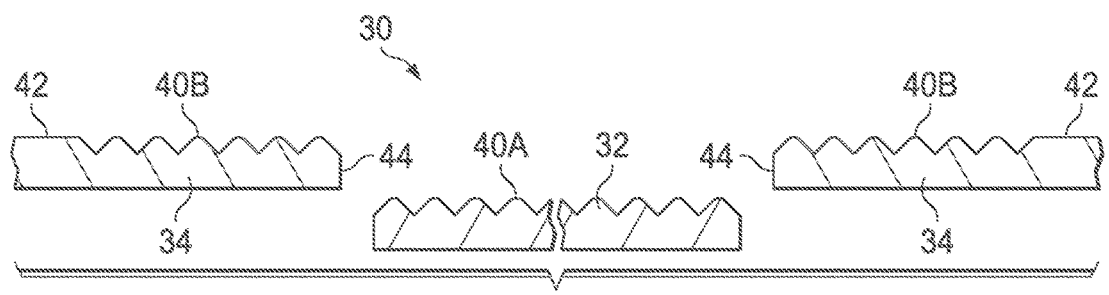

FIG. 2B illustrates an example cross-section through leadframe pad 32 and a pair of leads 34 on opposite sides of the leadframe pad 32, showing a roughened pad area 40A of leadframe pad 32 and roughened lead areas 40B of leads 34, after a roughening process discussed above at step 108. In this example, the full area of the top of leadframe pad 32 is roughened, while only a portion of the top surface area of each lead 34 is roughened, in particular at the end 44 of each lead 34 proximate the pad 32 (respective bottom surfaces of leadframe pad 32 and/or leads 34 may also be roughened). Thus, in this example, each lead 34 has a roughened lead area 40B at the end nearest to the pad 32, and an unroughened lead area 42 further from the pad 32.

Any suitable roughening process may be used to roughen the leadframe surfaces, such as a copper plating or etching process, for example. In some embodiments, the roughening process is performed to the already-formed leadframe 30. Thus, the roughening process may be performed on the already formed and cut leadframes 30, i.e., after and distinct from steps 102-106 shown in FIG. 1. In other embodiments, the roughening process may be performed integrally with the forming of the leadframe itself, i.e., step 108 may be performed during, between, or before any or all of steps 102-106 shown in FIG. 1. For example, the wafer 20 may be manufactured or formed such that one or more surfaces (that subsequently define one or more leadframe surfaces after cutting the wafer to define a plurality of discrete leadframes) have an average roughness $R_a$ as specified below for various embodiments (e.g., an average roughness $R_a$ of at least 150 µm, at least 200 µm, at least 250 µm, or at least 300 µm, or an average roughness $R_a$ between 150 µm and 200 µm, between 200 µm and 250 µm, between 250 µm and 300 µm, or between 300 µm and 350 µm).

Areas of the leadframe 30, e.g., at the ends of the leads 34 proximate the pad 32, may be coated or plated with a thin playing layer 50 of any suitable material to provide a desired electrical and mechanical contact (e.g., via wire bond) between the IC die 60 subsequently mounted to the leadframe 30 and the material of the leads 34 (in the example discussed herein, copper). In some embodiments, e.g., as discussed herein, the thin plating layer 50 comprises silver. In other embodiments, e.g., as discussed herein, the thin plating layer 50 may comprise another other suitable material(s). The thin plating layer 50 may be applied in any suitable manner. For example, leadframe 30 may be masked using any suitable masking equipment and technique, and a silver plating may then be then applied to the exposed areas of the leadframe 30.

Figure 2C:
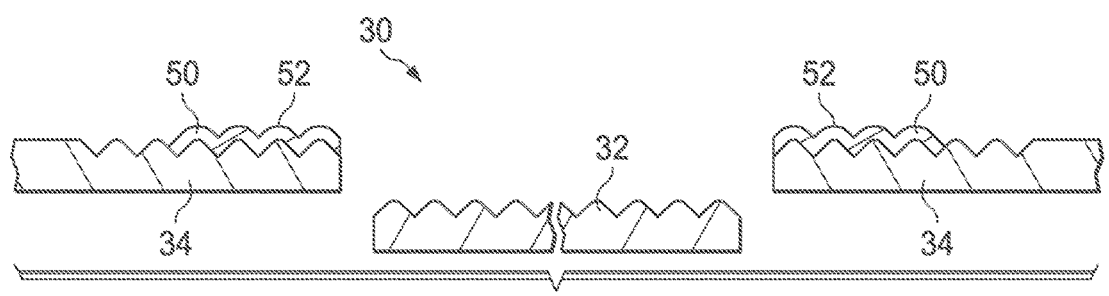

FIG. 2C illustrates an example thin plating layer 50, e.g., silver plating, deposited of otherwise applied over the roughed lead areas 40B. In some embodiments, the thin plating layer is sufficiently thin such that the plating material flows into contours of the underlying roughened leadframe surface areas 40, and thus form a contoured outer surface 52 of the thin plating layer itself. Various aspects of this concept are discussed in greater detail below.

In this example, the thin plating layer 50 is applied to only a portion of the roughened lead area 40B on each lead 34, in particular near the end of each lead 34 closest to the pad 32. In other embodiments, the thin plating may be applied over the full roughened lead area 40B, e.g., coextensive with each roughened lead area 40B or extending beyond one or more roughened lead areas 40B in one or more directions (e.g., to thereby cover one or more unroughened areas of the leadframe surface).

In other embodiments, any other area or areas of the leadframe pad 32 and/or each lead 34 may be roughened or left unroughened, and any other area or areas of the leadframe pad 32 and/or each lead 34 may be plated with the thin plating layer 50. For example, in some embodiments, the entire top surface and/or bottom surface of the leadframe 30, including pad 32 and leads 34 is roughened. Thus, in such embodiments, the roughening step may be performed before the wafer cutting step 106, e.g., before or after mounting the wafer at step 104, or the roughening step may be performed after the wafer cutting step 106 as discussed above.

As another example, in some embodiments, the only a partial area or areas of the leadframe pad 32 are roughened. As discussed above, in the illustrated example, only a portion of each lead 34, at the end of the lead proximate the pad 32, is roughened. In other embodiments, other partial area or areas of each lead 34 (or a subset of the leads 34) is roughened. In addition, the thin plating layer may be applied to some or all of the roughened pad area 40A and/or roughened lead areas 40B, depending on the particular embodiment.

Figure 2D:
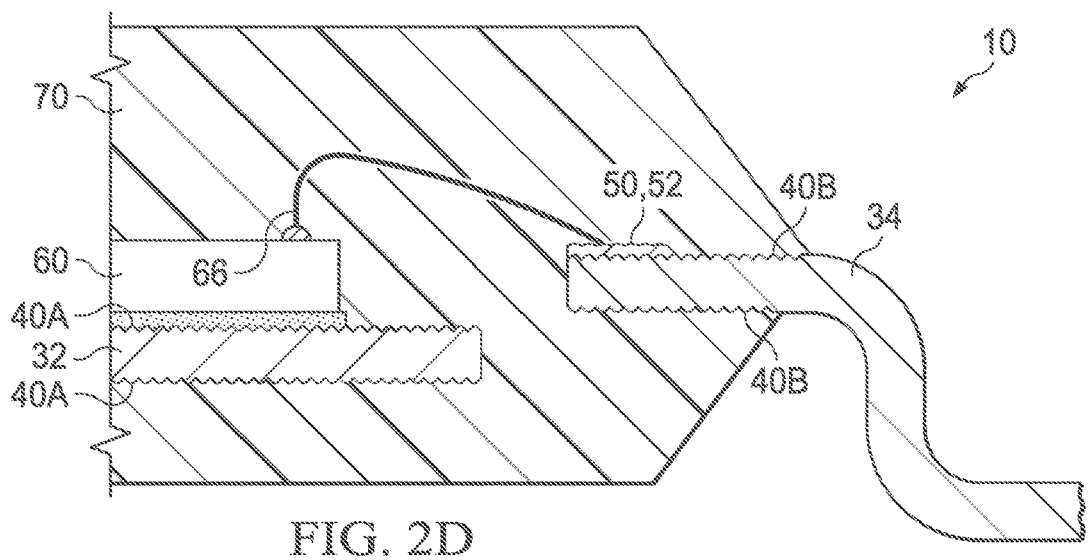

FIG. 2D illustrates a cross-sectional view of the integrated circuit structure 10, e.g., chip, after mounting a die 60 to the leadframe pad 32, forming wire bonds 66, and encasing the structure in a molding compound 70, e.g., as discussed above regarding FIG. 1. In some embodiments, molding compound 70 may comprise any suitable plastic or epoxy material(s). The molding compound 70 may directly contact one or more of (a) one or more roughened leadframe pad surface area(s) 40A, (b) one or more roughened but unplated lead surface areas 40B, (c) one or more contoured surface areas 52 of the thin plating layer 50 formed over roughened lead surface areas 40B, and/or (d) one or more unroughened and unplated surface areas of leadframe pad 32, one or more leads 34, or any other structure (e.g., surface of the die 60).

As discussed above, the thin plating layer 50 (e.g., silver plating) may provide an electrical and mechanical contact (e.g., via wire bond) between an IC die 60 mounted on the leadframe pad 32 and the material of the leads 34. Further, as discussed above and shown in FIG. 2C, if a sufficiently thin plating layer is formed over sufficiently roughened leadframe surface areas 40, the thin plating layer 50 may flow into the contours of the roughened leadframe surface and thus form a contoured outer surface 52 of the thin plating layer itself. This contoured outer surface 52 of the plating layer 50 may increase adhesion of molding compound 70 to the leadframe in the plated areas of the leadframe 30, and may decrease or eliminate delamination of the molding compound 70 from the leadframe 30 over time.

The inventors have found that certain dimensions or dimensional relationships of the relevant structures may be important or critical for providing improved adhesion and/or delamination properties of the structure. For example, one or more of (a) the roughness characteristics (e.g., average roughness) of the roughened leadframe surface areas 40, (b) the thickness (e.g., average thickness) of the thin plating layer 50, and/or (c) the relationship (e.g., ratio) between (a) and (b) may be may be important or critical for providing improved adhesion and/or delamination properties of the structure.

Accordingly, in some embodiments, relevant areas of the leadframe 30 are roughened (e.g., at step 108) to provide roughened leadframe surface areas 40 having an average roughness $R_a$ (using the standard definition of average roughness $R_a$) of at least 150 μm, at least 200 μm, at least 250 μm, or at least 300 μm, and/or depending on the thickness of the thin plating layer 50 to be applied over the roughened leadframe surface areas 40. In some embodiments, roughened leadframe surface areas 40 are roughened to an average roughness $R_a$ of between 150 μm and 200 μm, between 200 μm and 250 μm, between 250 μm and 300 μm, or between 300 μm and 350 μm.

In some embodiments, the thickness of the thin plating layer 50 is less than or equal to 3.75 μm, less than or equal to 3.0 μm, less than or equal to 2.5 μm, less than or equal to 2.0 μm, less than or equal to 1.5 μm, or less than or equal to 1.0 μm, depending on the particular embodiment and/or depending on the average roughness $R_a$ of the underlying roughened leadframe surface areas 40.

In some embodiments, the thickness of the thin plating layer 50 is between 1.0 μm and 3.75 μm, between 1.0 μm and 3.0 μm, between 1.0 μm and 2.5 μm, between 1.0 μm and 2.0 μm, or between 1.0 μm and 1.5 μm.

In some embodiments, the average roughness $R_a$ of the roughened leadframe surface area 40 is at least 0.150 μm, and the average thickness of the thin plating layer 50 is less than or equal to 3.75 μm.

In some embodiments, the ratio between the average thickness of the thin plating layer 50 and the average roughness $R_a$ of the roughened leadframe surface areas 40 is less than 40. In other embodiments, the ratio between the average thickness of the thin plating layer 50 and the average roughness $R_a$ of the roughened leadframe surface areas 40 is less than 30, less than 20, less than 10, or less than 5, depending on the particular embodiment.

As mentioned above, any suitable area(s) of the leadframe 30 may be roughened and/or plated by thin plating layer 50. For example, FIG. 3 shows a cross-section of a leadframe 30 similar to FIG. 2D, but wherein the thin plating layer 50 is applied over a selected area of the lead 34 spaced away (set back) from the end 44 of the lead 34, such that the molding compound 70 may directly contact and bond with unplated roughened surface area(s) 40B outside the thin plating layer 50, as well as contacting and bonding with the contoured outer surface of the thin plating layer 50 itself.

Figure 3:
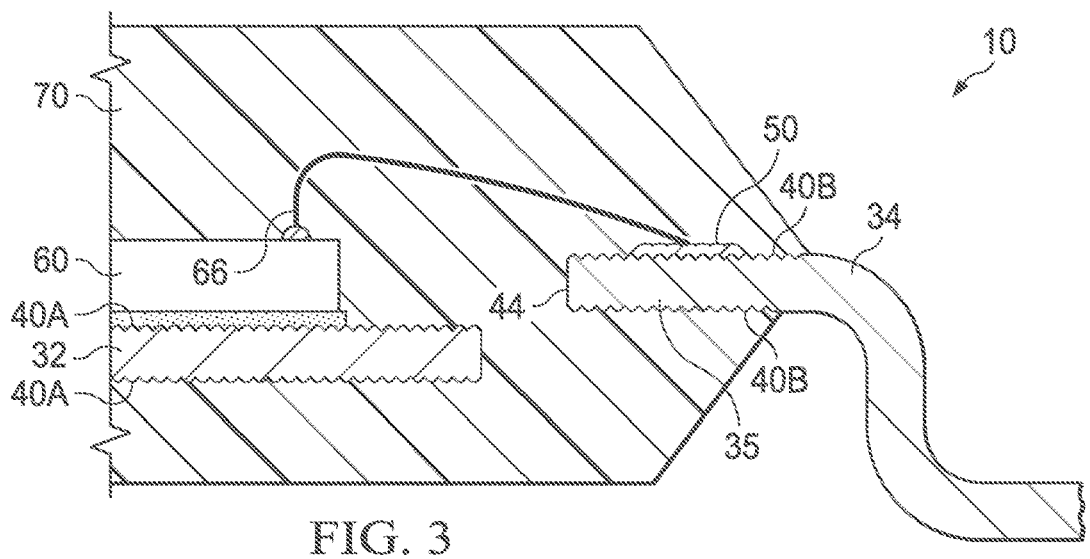
FIG. 3 shows a cross-section of an example leadframe similar to FIG. 2D, but wherein the thin plating layer is applied over a selected area spaced away (set back) from the lead tip.
Figure 4A:
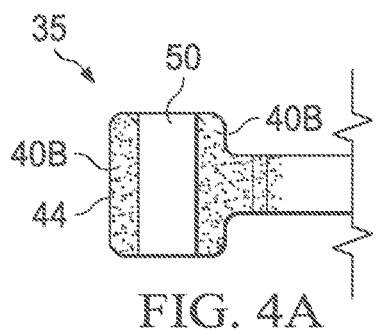
FIG. 4A shows a top view of the lead tip shown in FIG. 3, according to one example embodiment.
Figure 4B:
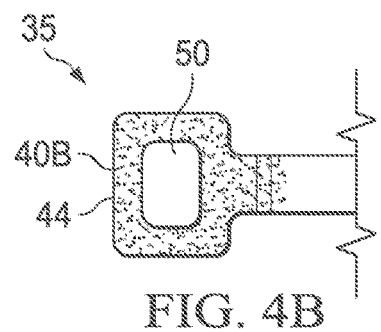
FIG. 4B shows a top view of the lead tip shown in FIG. 3, according to another example embodiment.

FIGS. 4A and 4B illustrate top views of the tip 35 of the lead 34 shown in FIG. 3, according to two example embodiments. In the embodiment shown in FIG. 4A, the thin plating layer 50 is applied in the shape of a strip extending across the lead tip 35, to define two distinct unplated roughened surface areas 40B on opposing sides of the thin plating layer 50. In the embodiment shown in FIG. 4B, the thin plating layer 50 is applied within the area of the lead tip 35, to define a unplated roughened surface areas 40B that defines a ring extending around the thin plating layer 50.

The teachings herein may provide various advantages. First, the delamination between the leadframe and mold compound may be eliminated or substantially reduced. The resulting devices may thus be more likely to meet JEDEC MSL1 reliability standards. Further, the product reliability and lifetime of the resulting IC devices may be extended. Occurrences of lifted, broken wire bonds in field failures, and corresponding customer complaints, may be substantially reduced or eliminated. Further, the disclosed solution may provide cost savings in packing methodology, e.g., by eliminating the need for dry pack, as compared with solutions such as downgrade devices to MSL3. Finally, the production cycle time may be reduced, due to no baking process.

Although the disclosed embodiments are described in detail in the present disclosure, it should be understood that various changes, substitutions and alterations can be made to the embodiments without departing from their spirit and scope.

What is claimed is:

1. A method for manufacturing an integrated circuit device, the method comprising:
   providing a leadframe comprising:
      a die support area configured to receive an integrated circuit die; and
      a leadframe lead adjacent the die support area;
   after providing the leadframe, roughening a surface of the leadframe lead to form a roughened leadframe lead surface having three-dimensional contours having an average roughness Ra defined by an average distance from the roughened leadframe lead surface to a mean plane of the roughened leadframe lead surface, along a direction perpendicular to the mean plane;
   forming a thin plating layer over at least a portion of the roughened leadframe lead surface to define a plated leadframe lead area, the thin plating layer having a thickness of less than 40 times the average roughness Ra of the roughened leadframe lead surface, such that the thin plating layer is received into the three-dimensional contours of the roughened leadframe lead surface and thereby forms a three-dimensionally contoured surface at an outer surface of the thin plating layer; and
   applying a molding material over the leadframe and integrated circuit die such that the molding material contacts and adheres to the three-dimensionally contoured surface at the outer surface of the thin plating layer.

2. The method of claim 1, wherein the thin plating layer comprises silver.

3. The method of claim 1, wherein the leadframe comprises copper, and the thin plating layer comprises silver.

4. The method of claim 1, wherein:
   the leadframe comprises a plurality of leadframe leads adjacent the die support area; and
   the method comprises roughening a surface of each leadframe lead to form a roughened leadframe lead surface on each leadframe lead, and forming a thin plating layer on each roughened leadframe lead surface, wherein a ratio of the thin plating layer thickness to the average roughness Ra of the respective roughened leadframe lead surface is less than 40.

5. The method of claim 1, further comprising forming a wire bond between the plated leadframe lead area of the leadframe lead and the integrated circuit die on the die support area; and wherein the molding material is applied over the wire bond.

6. The method of claim 1, wherein:
   the leadframe lead includes a first area and a second area adjacent the first area;
   roughening a surface of the leadframe lead comprises roughening a surface of both the first area and the second area of the leadframe lead to form a roughened first area surface and a roughened second area surface; and
   forming a thin plating layer over the roughened leadframe lead surface comprises forming a thin plating layer over the roughened first area surface but not over the roughened second area surface.

7. The method of claim 6, wherein:
   the first area of the leadframe lead, on which the thin plating layer is formed, is located at an end of the leadframe lead adjacent the die support area; and
   the second area of the leadframe lead, on which the thin plating layer is not formed, is located away from the end of the leadframe lead, such that the first area of the leadframe lead is located between the second area of the leadframe lead and the die support area.

8. The method of claim 6, wherein:
   the second area of the leadframe lead, on which the thin plating layer is not formed, is located at an end of the leadframe lead adjacent the die support area; and
   the first area of the leadframe lead, on which the thin plating layer is formed, is located away from the end of the leadframe lead, such that the second area of the leadframe lead is located between the first area of the leadframe lead and the die support area.

9. The method of claim 6, comprising applying the molding material over both the first area and second area of the leadframe lead, such that the molding material (a) directly contacts the thin plating layer formed on the first area of the leadframe lead and (b) directly contacts the roughened second area surface of the second area of the leadframe lead, which is free of the thin plating layer.

10. The method of claim 1, wherein the thickness of the thin plating layer is less than or equal to 3.75 µm.

11. The method of claim 1, wherein:
   the average roughness Ra of the roughened leadframe lead surface is at least 0.150 µm; and
   the thickness of the thin plating layer is less than or equal to 3.75 µm.

12. The method of claim 4, wherein the ratio of the thin plating layer thickness to the average roughness Ra of the respective roughened leadframe lead surface is less than 30.

13. The method of claim 4, wherein the ratio of the thin plating layer thickness to the average roughness Ra of the respective roughened leadframe lead surface is less than 20.

14. The method of claim 4, wherein the ratio of the thin plating layer thickness to the average roughness Ra of the respective roughened leadframe lead surface is less than 10.

15. The method of claim 4, wherein the ratio of the thin plating layer thickness to the average roughness Ra of the respective roughened leadframe lead surface is less than 5.

16. The method of claim 1, further comprising:
   roughening a surface of the die support area; and
   securing the integrated circuit die to the roughened surface of the die support area using an epoxy.

17. The method of claim 1, further comprising:
   forming the leadframe by a process including forming a wafer and cutting the wafer into a plurality of leadframes; and wherein roughening the surface of the leadframe lead is performed after forming the leadframe.

18. An integrated circuit structure, comprising:
a leadframe comprising:
  a die support area configured to receive an integrated circuit die; and
  a plurality of leadframe leads adjacent the die support area, each leadframe lead including a finger tip area at one end of the leadframe lead;
wherein at least one of the leadframe leads has a roughening leadframe lead surface formed by a roughening process, each roughening leadframe lead surface having three-dimensional contours having an average roughness Ra defined by an average distance from the respective roughened leadframe lead surface to a mean plane of the respective roughened leadframe lead surface, along a direction perpendicular to the mean plane;
a thin plating layer formed over at least a portion of each roughened leadframe lead surface, the thin plating layer on each roughened leadframe lead surface having a thickness of less than 40 times the average roughness Ra of the respective roughened leadframe lead surface, such that each respective thin plating layer is received into the three-dimensional contours of the respective roughened leadframe lead surface and thereby forms a three-dimensionally contoured surface at an outer surface of the respective thin plating layer; and
a molding material formed over the leadframe and integrated circuit die such that the molding material contacts and adheres to the three-dimensionally contoured surface at the outer surface of each thin plating layer.

19. The integrated circuit structure of claim 18, wherein:
each leadframe lead includes a first area having a roughened first area surface and a second area adjacent the first area and having a roughened second area surface; and
the thin plating layer is formed over the roughened first area surface but not over the roughened second area surface of each respective leadframe lead.

20. The integrated circuit structure of claim 19, wherein the molding material is formed over both the first area and second area of each leadframe lead, such that the molding material (a) directly contacts the thin plating layer formed on the first area of each respective leadframe lead and (b) directly contacts the roughened second area surface of the second area of each respective leadframe lead.

21. The integrated circuit structure of claim 18, wherein:
the average roughness Ra of each roughened leadframe lead surface is at least 0.150 µm; and
the thickness of the thin plating layer formed over each roughened leadframe lead surface is less than or equal to 3.75 µm.

22. The integrated circuit structure of claim 18, wherein the thickness of the of the thin plating layer on each roughened leadframe lead surface is less than 10 times the average roughness $R_a$ of the respective roughened leadframe lead surface.

23. The integrated circuit structure of claim 19, wherein:
the second area of the leadframe lead, on which the thin plating layer is not formed, is located at an end of the leadframe lead adjacent the die support area; and
the first area of the leadframe lead, on which the thin plating layer is formed, is located away from the end of the leadframe lead, such that the second area of the leadframe lead is located between the first area of the leadframe lead and the die support area.

24. An integrated circuit device including a leadframe having a die support area with an integrated circuit die mounted thereon and a leadframe lead adjacent the die support area, the integrated circuit device produced by a method comprising:
roughening a surface of the leadframe lead to form a roughened leadframe lead surface having three-dimensional contours having an average roughness Ra defined by an average distance from the roughened leadframe lead surface to a mean plane of the roughened leadframe lead surface, along a direction perpendicular to the mean plane;
forming a thin plating layer over at least a portion of the roughened leadframe lead surface to define a plated leadframe lead area, the thin plating layer having a thickness of less than 40 times the average roughness Ra of the roughened leadframe lead surface, such that the thin plating layer is received into the three-dimensional contours of the roughened leadframe lead surface and thereby forms a three-dimensionally contoured surface at an outer surface of the thin plating layer; and
applying a molding material over the leadframe and integrated circuit die such that the molding material contacts and adheres to the three-dimensionally contoured surface at the outer surface of the thin plating layer.

25. An integrated circuit device of claim 24, wherein:
the leadframe lead includes a first area and a second area adjacent the first area;
roughening a surface of the leadframe lead comprises roughening a surface of both the first area and the second area of the leadframe lead to form a roughened first area surface and a roughened second area surface; and
forming a thin plating layer over the roughened leadframe lead surface comprises forming a thin plating layer over the roughened first area surface but not over the roughened second area surface.

26. An integrated circuit device of claim 25, wherein:
the second area of the leadframe lead, on which the thin plating layer is not formed, is located at an end of the leadframe lead adjacent the die support area; and
the first area of the leadframe lead, on which the thin plating layer is formed, is located away from the end of the leadframe lead, such that the second area of the leadframe lead is located between the first area of the leadframe lead and the die support area.

27. An integrated circuit device of claim 25, wherein the method of producing the integrated circuit device comprises applying the molding material over both the first area and second area of the leadframe lead, such that the molding material (a) directly contacts the thin plating layer formed on the first area of the leadframe lead and (b) directly contacts the roughened second area surface of the second area of the leadframe lead, which is free of the thin plating layer.

28. An integrated circuit device of claim 24, wherein:
the average roughness Ra of the roughened leadframe lead surface is at least 0.150 µm; and
the thickness of the thin plating layer is less than or equal to 3.75 µm.

29. An integrated circuit structure, comprising:
a leadframe comprising:
  a die support area; and
  a plurality of leadframe leads adjacent the die support area, each leadframe lead including a finger tip area at one end of the leadframe lead;

an integrated circuit die mounted on the die support area of the leadframe;

wherein at least one of the leadframe leads has a roughening leadframe lead surface formed by a roughening process, each roughening leadframe lead surface having three-dimensional contours having an average roughness Ra defined by an average distance from the respective roughened leadframe lead surface to a mean plane of the respective roughened leadframe lead surface, along a direction perpendicular to the mean plane;

a thin plating layer formed over at least a portion of each roughened leadframe lead surface, the thin plating layer on each roughened leadframe lead surface having a thickness of less than 40 times the average roughness Ra of the respective roughened leadframe lead surface, such that each respective thin plating layer is received into the three-dimensional contours of the respective roughened leadframe lead surface and thereby forms a three-dimensionally contoured surface at an outer surface of the respective thin plating layer; and a molding material formed over the leadframe and integrated circuit die such that the molding material contacts and adheres to the three-dimensionally contoured surface at the outer surface of each thin plating layer.

30. The integrated circuit structure of claim 29, wherein:
the leadframe lead includes a first area and a second area adjacent the first area;
roughening a surface of the leadframe lead comprises roughening a surface of both the first area and the second area of the leadframe lead to form a roughened first area surface and a roughened second area surface; and
forming a thin plating layer over the roughened leadframe lead surface comprises forming a thin plating layer over the roughened first area surface but not over the roughened second area surface.

31. An integrated circuit device of claim 30, wherein:
the second area of the leadframe lead, on which the thin plating layer is not formed, is located at an end of the leadframe lead adjacent the die support area; and
the first area of the leadframe lead, on which the thin plating layer is formed, is located away from the end of the leadframe lead, such that the second area of the leadframe lead is located between the first area of the leadframe lead and the die support area.

32. An integrated circuit device of claim 30, wherein the method of producing the integrated circuit device comprises applying the molding material over both the first area and second area of the leadframe lead, such that the molding material (a) directly contacts the thin plating layer formed on the first area of the leadframe lead and (b) directly contacts the roughened second area surface of the second area of the leadframe lead, which is free of the thin plating layer.

33. An integrated circuit device of claim 29, wherein:
the average roughness Ra of the roughened leadframe lead surface is at least 0.150 μm; and
the thickness of the thin plating layer is less than or equal to 3.75 μm.

* * * * *